(12) United States Patent
Sanford et al.

(10) Patent No.: US 9,831,573 B2
(45) Date of Patent: Nov. 28, 2017

(54) LOW PROFILE CONNECTOR

(71) Applicant: Apple Inc., Cupertino, CA (US)

(72) Inventors: Emery A. Sanford, Cupertino, CA (US); Tyson B. Manullang, Cupertino, CA (US); David G. Havskjold, Cupertino, CA (US); Tyler S. Bushnell, Cupertino, CA (US); Eric S. Jol, Cupertino, CA (US); Anthony S. Montevirgen, Cupertino, CA (US); John Raff, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 392 days.

(21) Appl. No.: 14/300,855

(22) Filed: Jun. 10, 2014

(65) Prior Publication Data

US 2015/0357733 A1   Dec. 10, 2015

(51) Int. Cl.
| | |
|---|---|
| *H05K 1/00* | (2006.01) |
| *H01R 12/62* | (2011.01) |
| *H05K 1/11* | (2006.01) |
| *H05K 1/14* | (2006.01) |
| *H01R 13/62* | (2006.01) |
| *H01R 12/52* | (2011.01) |

(52) U.S. Cl.
CPC ............ *H01R 12/62* (2013.01); *H01R 12/52* (2013.01); *H05K 1/14* (2013.01); *H05K 1/142* (2013.01); *H05K 1/147* (2013.01); *H05K 1/148* (2013.01); *H05K 2201/046* (2013.01); *H05K 2201/05* (2013.01); *H05K 2201/1034* (2013.01); *H05K 2201/10325* (2013.01); *H05K 2201/10681* (2013.01)

(58) Field of Classification Search
CPC ..... H05K 2201/05; H05K 2201/10681; H05K 1/14; H05K 1/142; H05K 1/147; H05K 1/148; H05K 2201/046; H05K 2201/10325; H05K 2201/1034; H05K 1/118; H05K 3/4691; H01R 43/0256; H01R 43/0235; H01R 12/707; H01R 13/6587
USPC ....... 361/749, 784, 785, 786, 789, 792, 803; 439/83, 329, 430, 607.46, 620.15, 876
See application file for complete search history.

(56) References Cited

U.S. PATENT DOCUMENTS

| | | | | |
|---|---|---|---|---|
| 4,628,410 A | * | 12/1986 | Goodman | ............... H05K 3/341 361/776 |
| 7,077,694 B2 | * | 7/2006 | Nakano | ................ H01R 12/707 439/533 |
| 2010/0112833 A1 | * | 5/2010 | Jeon | ...................... H01R 12/523 439/78 |
| 2014/0177180 A1 | * | 6/2014 | Malek | .................... H05K 7/142 361/749 |

* cited by examiner

*Primary Examiner* — Binh Tran
(74) *Attorney, Agent, or Firm* — David K. Cole (57) ABSTRACT

An electrical board-to-board connector including a flexible cable assembly having a low profile or dimensionally reduced configuration. The connector body of a cable assembly may be widened to provide the structural rigidity sufficient to support an array of solder lead connections. Other support elements may be omitted from the cable assembly, which results in a reduced height dimension. The flexible cable assembly may also include a cowling used to retain the cable assembly against a circuit board. The cowling may also be configured to reduce the dimensions or dimensional footprint of the connection.

12 Claims, 11 Drawing Sheets

FIG. 1

SECTION A-A
FIG. 4

FIG. 6

SECTION B-B
FIG. 8

LOW PROFILE CONNECTOR

TECHNICAL FIELD

This disclosure relates generally to electrical connectors for electrically connecting a flexible cable to a circuit board, and more specifically to a flexible cable assembly having an electrical connector with a low-profile or dimensionally reduced configuration.

BACKGROUND

The size and form factor of a personal electronic device may be a driving constraint on the size and configuration of the electronics of the device. In order to maximize use of the available space, an electronic device may include multiple printed circuit boards (PCBs) that are electrically connected to each other using various types of electrical connectors. In some cases, a board-to-board connector may be used to connect two PCBs located in the same housing or enclosure. A board-to-board connector typically includes a conduit connected to a terminal connector that can be attached to a PCB having a corresponding mating connector. However, some traditional board-to-board connectors may be too tall to be used in particularly small electronic devices. For example, some traditional board-to-board connectors have a height that exceeds the height of other components on the PCB, and thus are the limiting factor in how close a PCB can be placed to another PCB or other component within the device housing or enclosure.

Thus, there is a need in some circumstances to reduce the height of electrical connectors. In particular, there is a need for a board-to-board connector having a reduced height to facilitate packaging of components in small spaces. However, an electrical connectors having a reduced height must still satisfy other functional criteria, including sufficient rigidity, reliability, and operability of the connector. It is with respect to these and other general considerations that the embodiments described herein are directed. Also, although relatively specific problems have been discussed, it should be understood that the embodiments should not be limited to solving the specific problems identified in the background.

SUMMARY

The embodiments described herein are directed to a flexible cable assembly having a low profile or dimensionally reduced configuration. In particular, the connector body of a cable assembly may be widened to provide the structural rigidity sufficient to support an array of solder lead connections. In some cases, other support elements may be omitted from the cable assembly, which results in a reduced height dimension. Some embodiments discussed herein are directed to techniques for attaching a cowling used to retain the cable assembly against a circuit board.

One example embodiment is directed to a flexible cable assembly used to electrically connect a first circuit board to another electronic component. The flexible cable assembly includes a flexible circuit having a first end and a second end. A connector body is attached to the first end of the flexible circuit and is configured to electrically connect the first circuit board to the flexible circuit. The connector body attaches to the flexible circuit via an array of solder leads. In the present example, the array of solder leads are formed into and substantially supported by the connector body. In some cases, the array of solder leads are fully encapsulated in the connector body except for a contact area that is in electrical contact with the flexible circuit. The array of solder leads may be electrically connected to a corresponding array of contact pad regions formed into a surface of the flexible circuit.

In some embodiments, the flexible cable assembly does not include a support element attached to the flexible circuit. In some embodiments, the support element is a separate part configured to reduce bending of the flexible circuit near the first end.

In some embodiments, the flexible cable assembly includes a sacrificial solder connection formed between the flexible circuit and the connector body, wherein the sacrificial solder connection is not configured to pass an electrical current between an electrical component and the flexible cable assembly. In some cases, the sacrificial solder connection is located proximate to one end of the connector body.

In some embodiments, the flexible cable assembly includes a removable lining that is attached to the first end of the flexible circuit. The removable lining may be configured to be detached after the flexible cable assembly has been installed. In some cases, the removable lining is attached using an adhesive and the adhesive is configured to be detached and reattached to the flexible circuit.

Another example embodiment is directed to a flexible cable assembly for electrically connecting a first circuit board to another electronic component, the cable assembly. The flexible cable assembly includes a flexible circuit having a first end and a second end. A connector body is attached to the first end of the flexible circuit on a first side and configured to mechanically and electrically connect to a mating connector attached to the first circuit board. A cowling is disposed above the cable assembly and the first circuit board and may be configured to be attached directly to the mating connector that is attached to the first circuit board. In some cases, the mating connector includes a threaded portion for receiving a fastener used to attach the cowling to the mating connector. In some cases, the cowling is directly attached to a second side of the flexible circuit, opposite to the first side.

Another example embodiment is directed to a flexible cable assembly for electrically connecting a first circuit board to another electronic component. The flexible cable assembly includes a flexible circuit having a first end and a second end. A connector body is attached to the first end of the flexible circuit on a first side and configured to mechanically and electrically connect to a mating connector attached to the first circuit board. A cowling is attached to the flexible circuit on a second side opposite to the first side. The cowling may be configured to retain the flexible cable assembly to the first circuit board. In some cases, the cowling is configured to reduce bending of the flexible circuit near the first end.

In some cases, the cowling includes a hole for a threaded fastener used to attach the cowling to the first circuit board, and wherein the cowling includes an offset feature at one end of the cowling, and the hole is located within the offset feature.

In some cases, the cowling is configured to be attached directly to the mating connector that is attached to the first circuit board.

Another example embodiment is directed to a system for attaching a flexible cable assembly to a first circuit board. The system includes a first circuit board and a flexible cable assembly. The flexible cable assembly includes a flexible circuit having a first end and a second end. A connector body is attached to the first end of the flexible circuit on a first side and configured to mechanically and electrically connect to a mating connector attached to the first circuit board. A cowling is disposed above the cable assembly and the first circuit board. The system also includes a retainer clip configured to engage a top surface of the cowling and retain the flexible cable assembly to the first circuit board.

In one example embodiment, the retainer clip includes an undercut feature that is configured to engage the top surface of the cowling. In some cases, the cowling is configured to be installed by pressing the cowling toward the first circuit board, and the retainer clip is configured to deflect as the cowling is being installed and return to an un-deflected state when installation is complete. The cowling may include a tapered feature that is configured to engage an edge of the cowling as the cowling is installed. In some cases, a compressible element is disposed between a bottom surface of the cowling and a top surface of the circuit board.

DETAILED DESCRIPTION

The description that follows includes example systems and processes that embody various elements of the present disclosure. However, it should be understood that the described disclosure may be practiced in a variety of forms in addition to those described herein.

The following examples are directed to techniques for connecting a circuit board to another circuit board or other electronic device. In particular, the examples are directed to flexible cable assembly used as a board-to-board connector. Some embodiments include techniques or configurations for attaching the flexible cable assembly to a printed circuit board using a connection that reduces or minimizes the height of the connector or the dimensional footprint of the connector. The following examples may be particularly well suited for use in electronic devices having a compact enclosure or physical envelope for housing electronics.

Figure 1:
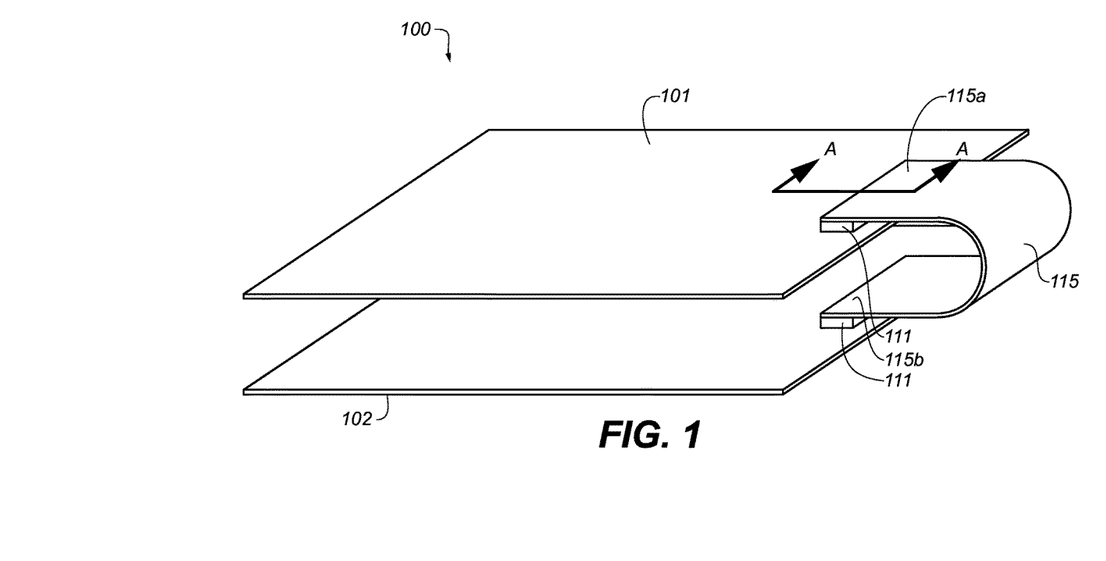
FIG. 1 depicts an example printed circuit board configuration with a board-to-board connector.

FIG. 1 depicts an example printed circuit board configuration with a board-to-board connector. In particular, FIG. 1 depicts an electronics system 100 having a first circuit board 101 electrically connected to a second circuit board 102 using a flexible cable assembly 110. Each circuit board includes multiple electrical components that form part of the electronics for an electronic device. The electronics system 100 may be physically integrated into an enclosure of an electronic device, including, without limitation, a mobile telephone, a wearable electronic device, a portable media player, a tablet computer, a laptop computer, a desktop computer, or the like.

In this example, the flexible cable assembly 110 electrically couples components from the first circuit board 101 to components on the second circuit board 102. The flexible cable assembly 110 includes a flexible circuit 115 having a first end 115a and a second end 115b. A first connector body 111 is attached to the first end 115a of the flexible circuit 115, and is used to electrically connect the first circuit board 101 to the flexible cable assembly 110. The first connector 111 may include an array of conductive terminals that are configured to mate with an array of corresponding conductive terminals of a mating connector attached to the first circuit board 101. In the present example, the first connector 111 of the flexible cable assembly 110 is configured to be connected and removed from the mating connector attached to the first circuit board 101. In some cases, this may facilitate removal of the first circuit board 101 from the electronics system 100.

Similarly, a second connector body 112 is attached to the second end 115b of the flexible circuit 115. The second connector body 112 is used to electrically connect the second circuit board 102 to the flexible circuit assembly 110. The second connector 112 may also include an array of conductive terminals that are configured to electrically couple with a mating connector attached to the first circuit board 102. The second connector 112 may also be configured to be removable to facilitate disconnection of the second circuit board 102 from the electronics system 100.

By using a flexible cable assembly 110, the orientation and alignment of the first 101 and second 102 circuit boards may vary without affecting the quality of the electrical connection between the boards. Also, the flexible cable assembly 110 may be used to electrically couple circuit boards in a variety of configurations. In this example, the first 101 and second 102 circuit boards are arranged to substantially overlap each other. However, in alternative embodiments, the printed circuit boards could be arranged in a variety of configurations. For example, the circuit boards could be offset from each other in a non-overlapping configuration, side-by-side in a substantially planar configuration, or arranged in different planes in a non-planar configuration. Alternatively, the flexible cable assembly 110 can be used to connect a circuit board with one or more other types of electronic components that may be placed in a variety of locations and orientations with respect to the circuit board.

FIGS. 2-5 discussed below, provide alternative configurations for attaching a flexible cable assembly to a printed circuit board. The following examples are provided with respect to a cross-sectional view taken along section A-A, shown in FIG. 1. Because each of these configurations uses variations of one or more parts, the individual item numbers may depart from item numbers depicted in FIG. 1. However, each of the flexible cable assemblies depicted in FIGS. 2-5 may be used in a multi-board electronics system 100, as depicted in FIG. 1.

Figure 2:
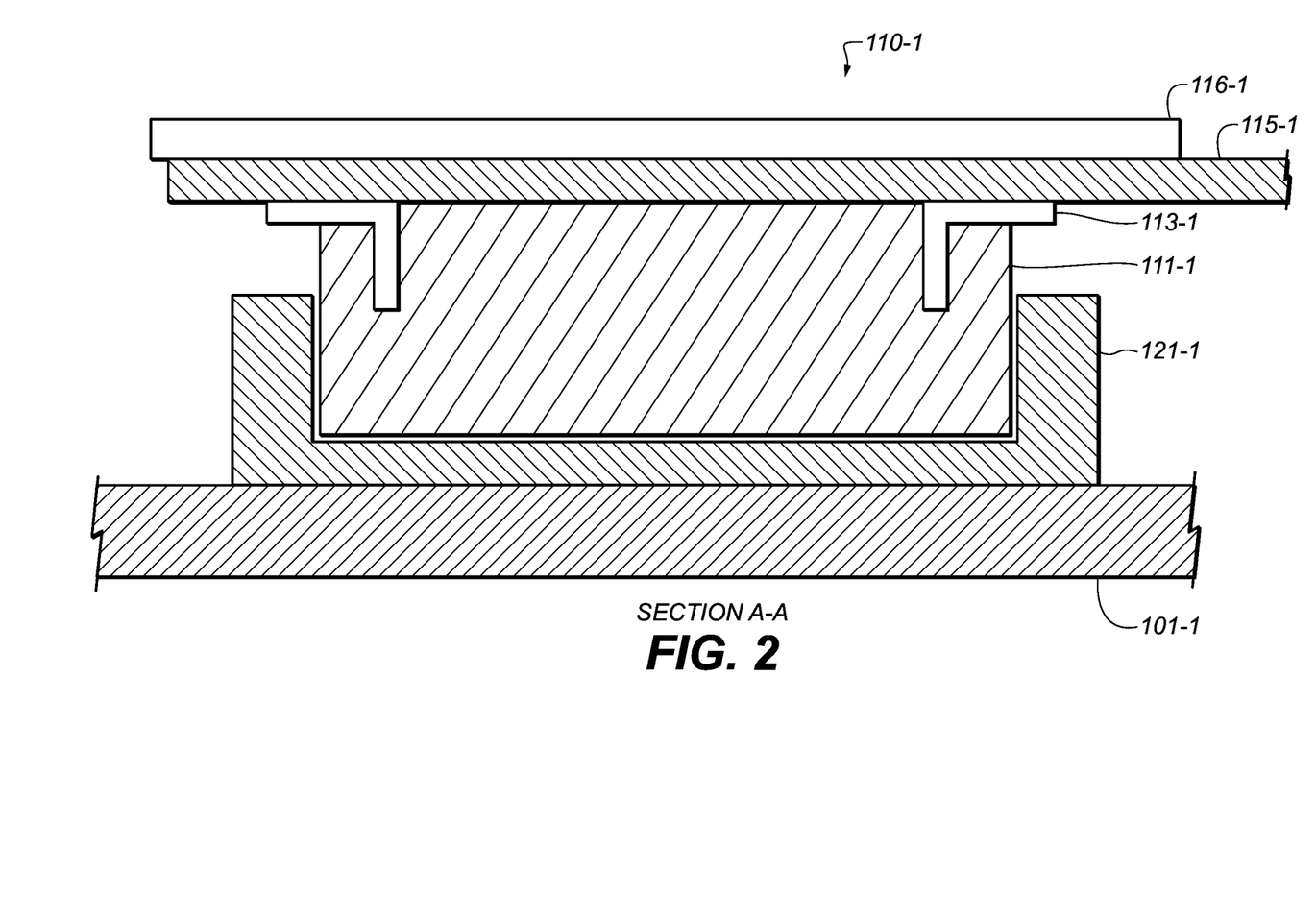
FIG. 2 depicts an example board-to-board connector.

FIG. 2 depicts an example board-to-board connector. In particular, FIG. 2 depicts a cross-sectional view along section A-A. As described above with respect to FIG. 1, the flexible cable assembly 110-1 is configured to electrically connect the circuit board 101-1 to another circuit board, or alternatively, with another type of electrical component.

The flexible cable assembly 115-1 is configured to electrically and mechanically couple to the circuit board 101-1. As shown in FIG. 2, the flexible cable assembly 110-1 includes a (male) connector body 111-1 attached to a first end of a flexible circuit 115-1. The male connector body 111-1 is configured to electrically couple to the mating (female) connector body 121-1. In this example, the mating female connector body 121-1 is electrically connected and mechanically attached to the circuit board 101-1.

As shown in FIG. 2, the flexible cable assembly 110-1 includes a support element 116-1 permanently attached to the flexible circuit 115-1. The support element 116-1 supports the flexible circuit 115-1 over the entire width of the flexible circuit, and particularly over regions of the flexible circuit 115-1 that are not supported by other elements, such as the connector body 111-1. The support element 116-1 may provide support to the flexible cable assembly 110-1 during assembly and disassembly of the flexible cable assembly 110-1 from the circuit board 101-1. In particular, the support element 116-1 may reduce bending of the flexible circuit 115-1 near the first end causing the connector body 111-1 to peal or pull away from the flexible circuit 115-1.

The support provided by the support element 116-1 may be necessary due, in part, to the type of connector used in this configuration. In particular, the connector body 111-1 is attached to the flexible circuit 115-1 via solder leads 113-1. In some cases, the solder leads 113-1 may be formed from a conductive, yet fragile metal material. Because a portion of the solder leads 113-1 are not supported by the connector body 111-1, they may be vulnerable to bending and/or breaking if the flexible circuit 115-1 is subjected to bending or deflection near the first end. In addition, deflection in the flexible circuit 115-1 near the solder leads 113-1 may weaken or destroy the solder joint between the flexible circuit 115-1 and the solder leads 113-1. In some cases, the stiffener element 116-1 prevents the flexible cable assembly 110-1 from delaminating due to stress or force placed on the assembly.

One drawback to including a separate support element 116-1, as shown in FIG. 2, is that the overall height of the connector interface is increased. In one example, the support element 116-1 is formed from stainless steel and is approximately 0.1 mm thick. If the support element 116-1 is made from a weaker material, the thickness of the support element 116-1 would be even greater. Thus, in some cases, it may be advantageous to provide a board cable assembly that does not require a separate support element and, therefore, can be reduced in height, as compared to connector assemblies that do include a separate support element.

Figure 3:
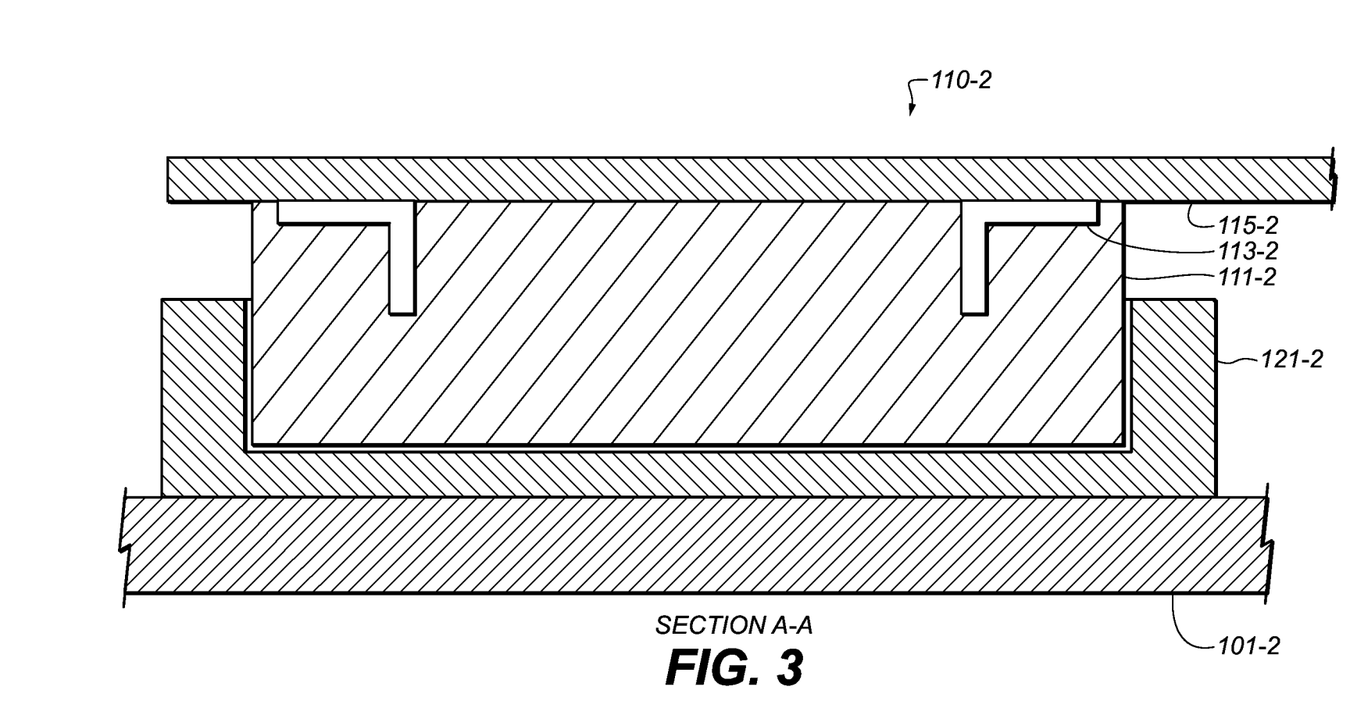
FIG. 3 depicts an example board-to-board connector without a support element.
Figure 4:
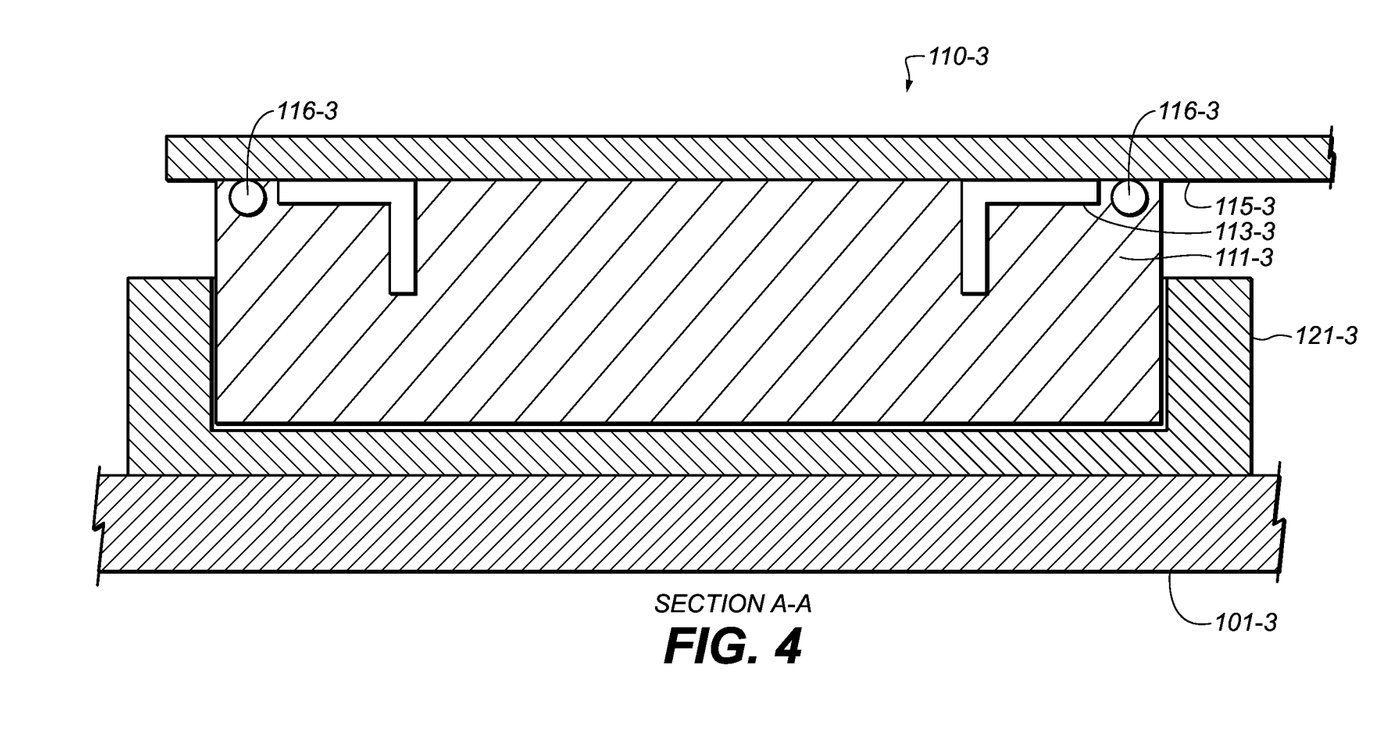
FIG. 4 depicts an example board-to-board connector having a sacrificial solder connection.
Figure 5:
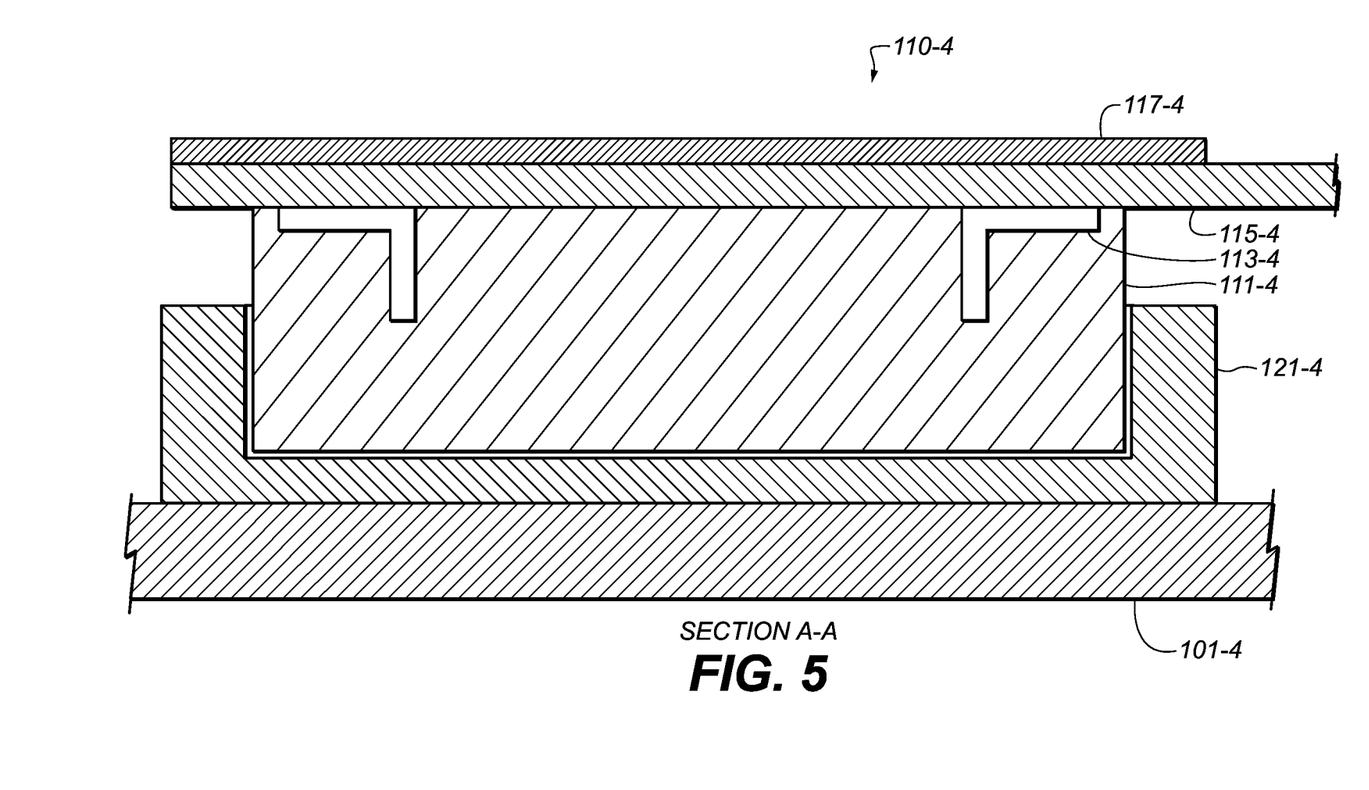
FIG. 5 depicts an example board-to-board connector having a removable liner.

FIGS. 3-5 depict example embodiments of connector assemblies that do not include a permanently attached support element. Thus, the example connector assemblies depicted in FIGS. 3-5 may have a reduced height dimension, and may be more appropriate for use in configurations that require that the thickness of the electronics be minimized.

FIG. 3 depicts one example of a board-to-board connector. In particular, FIG. 3 depicts a cross sectional view taken along section A-A of flexible cable assembly 110-2 that does not use a support element. Because the flexible cable assembly 110-2 does not include a support element, the overall height of the assembly can be reduced. In some cases, the overall thickness of the cable assembly 110-2 can be reduced by 0.1 mm or more as compared to the example cable assembly 110-1 provided above with respect to FIG. 2. Depending on the overall thickness of the flexible cable assembly 110-1 and the circuit board 101-2, this may represent a significant reduction in thickness. For example, if the overall height of the flexible cable assembly 110-1 and the circuit board 101-1 is approximately 0.7 mm, the elimination of the support element may represent more than a 10% reduction in overall height. Note that while the overall thickness or height of the cable assembly 110-2 may be reduced, other dimensions, such as the width of the cable assembly 110-2, may increase as compared to other connector configurations.

In the present example, the connector body 111-2 is configured to provide substantial support for the flexible circuit 115-2. In particular, the connector body 111-2 is attached to a first end of the flexible circuit 115-2 extends through the region where an array of solder leads 113-2 connect to the surface of the flexible circuit 115-2. In some cases, the connector body 111-2 provides substantial support for the flexible circuit 115-2 and, thus reduces deflection of the flexible circuit 115-2 at least in the solder region between the two components. In some cases, the array of solder leads 113-2 are formed into and substantially supported by the connector body 111-2. In some cases, the solder leads 113-2 are fully encapsulated by the connector body 111-2 except for a contact area that is in electrical contact with the flexible circuit 115-2. As previously mentioned, while this configuration may reduce the overall height or thickness of the flexible cable assembly 110-2, the width of the connector body 111-2 and mating connector 121-2 may increase, resulting in a larger connector footprint on the printed circuit board 101-2.

The configuration depicted in FIG. 3 may provide some advantages as compared to other types of connector configurations. Specifically, because the connector body 111-2 supports the solder leads 113-2, the solder leads 113-2 are less susceptible to strain and mechanical deflection. Accordingly, the solder leads 113-2 may be less prone to failure due to stress or force placed on the flexible cable assembly 110-2. Additionally, the solder connection between the solder leads 113-2 and the flexible circuit 115-2 may be substantially isolated from stress or force placed on the flexible cable assembly 110-2. Thus, in some cases, the added rigidity provided by the connector body 111-2 not only eliminates the need for a separate stiffener element, but it may improve the mechanical strength and reliability of the flexible cable assembly 110-2. This may be particularly beneficial if the flexible cable assembly 110-2 is configured to be assembled and disassembled over the lifetime of the device.

In the present example, the connector body 111-2 and solder leads 113-2 are mechanically joined and electrically connected to the flexible circuit 115-2 via one or more solder joints between the solder leads 113-2 and corresponding solder pad regions formed into the surface of the flexible circuit 115-2. In some cases, the solder pad regions may be formed from a conductive film that is formed into the flexible circuit 115-2 and at least partially exposed to facilitate electrical contact with the solder leads 113-2. In some cases, the solder terminals of the flexible circuit 115-2 and/or the solder leads 113-2 include a solder material that may be melted to create an electrical and mechanical bond between the two components. In some cases, the solder material may be melted or reflowed in a reflow oven as part of a surface mount manufacturing process.

In the present example, the flexible circuit 115-2 is formed from a laminate material that is configured to be subjected to substantial deflections without mechanical failure. For example, as shown in FIG. 1, the flexible circuit may be subjected to a 180 degree bend to connect two circuit boards that stacked and substantially overlap each other. This is provided as one example, and the flexible circuit 115-2 may be subjected to substantially greater deflections than as shown in FIG. 1. In some cases, the flexible circuit 115-2 formed from a dielectric film that is laminated with one or more conductive layers. The dielectric film may be formed from materials including, without limitation, polymide sheet, polyester sheet, or other non-conductive sheet material. The conductive layers may be formed from a metal foil material including, without limitation, copper, silver, gold or tin. The conductive layers may also be formed from another non-foil conductive material, such as indium tin oxide (ITO) or a conductive ink. In one example embodiment, the conductive layers are formed into one or more traces run the length of the flexible circuit 115-2 and electrically couple the connector bodies at either end of the assembly.

As shown in FIG. 3, the flexible cable assembly 110-2 is configured to electrically and mechanically couple to the circuit board 101-2. As shown in FIG. 3, the (male) connector body 111-2 is configured to electrically couple to the mating (female) connector body 121-2. In this example, the mating female connector body 121-2 is electrically connected and mechanically attached to the circuit board 101-2. As described above with respect to FIG. 1, the flexible cable assembly 110-2 may also be configured to electrically connect the circuit board 101-2 to another circuit board, or alternatively, with another type of electrical component of the electronic system.

The configuration depicted in FIG. 3 is only one example embodiment and other variations are possible. In particular, FIGS. 4 and 5 depict alternative configurations that can also be used to reduce the overall height of a board-to-board connector.

FIG. 4 depicts an example board-to-board connector having a sacrificial solder connection. In particular, FIG. 4 depicts a cross sectional view taken along section A-A of flexible cable assembly 110-3 that also does not use a support element. As with the previous example, because the flexible cable assembly 110-3 does not include a support element, the overall height of the assembly can be reduced.

As shown in FIG. 4, the connector body 111-3 is attached to a first end of the flexible circuit 115-3 and is configured to provide substantial support for the flexible circuit 115-3. Similar to as described above, the connector body 111-3 extends through the region where an array of solder leads 113-3 connect to the surface of the flexible circuit 115-3 and provides substantial support and reduces deflection of the flexible circuit 115-3. As shown in FIG. 4, the array of solder leads 113-3 are formed into and substantially supported by the connector body 111-3. In some cases, the solder leads 113-3 are fully encapsulated by the connector body 111-3 except for a contact area that is in electrical contact with the flexible circuit 115-3. The flexible circuit 115-3 may be formed in accordance with the example provided above with respect to FIG. 3.

In addition, the flexible cable assembly 110-3 depicted in FIG. 4 includes two sacrificial solder connections 116-3 located at each end of the connector body 111-3. The sacrificial solder connections 116-3 provide an additional mechanical bond between the connector body 111-3 and the flexible circuit 115-3 and may increase the overall rigidity of the flexible cable assembly 110-3. In particular, the sacrificial solder connections 116-3 help prevent the flexible circuit 115-3 from peeling away from the connector body 111-3. In some cases, the sacrificial solder connections 116-3 perform mechanical or structural support and do not necessarily perform an electrical function. For example, in some cases, the sacrificial solder connections 116-2 do not pass an electrical current between the flexible cable assembly 110-3 and the circuit board 101-3 or other electrical component.

The sacrificial solder connections 116-3 may be formed as part of the reflow process that is used to connect the solder leads 113-3 with the flexible circuit 115-3. In particular, the connector body 111-3 and/or the flexible circuit 115-3 may include a bead of solder material that may be melted in a reflow oven as part of a surface mount manufacturing process.

Similar to the examples described above, the flexible cable assembly 110-3 depicted in FIG. 4 is configured to electrically and mechanically couple to the circuit board 101-3. As shown in FIG. 4, the (male) connector body 111-3 is configured to electrically couple to the mating (female) connector body 121-3. In this example, the mating female connector body 121-3 is electrically connected and mechanically attached to the circuit board 101-3. As described above with respect to the previous examples, the flexible cable assembly 110-3 may also be configured to electrically connect the circuit board 101-3 to another circuit board, or alternatively, with another type of electrical component of the electronic system.

FIG. 5 depicts an example board-to-board connector having a removable liner. In particular, FIG. 5 depicts a cross sectional view taken along section A-A of flexible cable assembly 110-4 that uses a removable liner to provide additional support. Because the liner is removable, in accordance with the previous examples, the overall height of the assembly can be reduced.

As shown in FIG. 5, the connector body 111-4 is attached to a first end of the flexible circuit 115-4 and extends through the region where an array of solder leads 113-4 connect to the surface of the flexible circuit 115-4. As shown in FIG. 4, the array of solder leads 113-4 are formed into and substantially supported by the connector body 111-4, and may be fully encapsulated by the connector body 111-4. The flexible circuit 115-4 may be formed in accordance with the example provided above with respect to FIG. 3.

In addition, the example depicted in FIG. 5 includes a removable liner 117-4 attached to a surface of the flexible circuit 115-4. The removable liner 117-4 may provide additional support to resist bending of the flexible circuit 115-4 near the first end of the flexible circuit 115-4. In this example, the removable liner 117-4 extends across substantially the entire width of the flexible circuit 115-4 and is configured to be removed without damaging the flexible circuit 115-4 or other components of the flexible cable assembly 110-4. In some cases, the removable liner 117-4 is attached using a pressure sensitive adhesive (PSA) layer or other adhesive material.

Because the removable liner 117-4 can be detached before the final assembly of the device, the thickness of the removable liner 117-4 is not constrained by the dimensions of the device or of the enclosure housing the electronic system. Thus, the thickness of the removable liner 117-4 may be optimized to provide the structural rigidity necessary for the installation of the flexible cable assembly 110-4. In some cases, the removable liner 117-4 may also include one or more features that facilitates manual handling or use of assembly tools used to install the flexible cable assembly 110-4.

In some cases, the removable liner 117-4 is also configured to be detached after installation and reattached for disassembly or reinstallation of the flexible cable assembly 110-4. For example, the removable liner 117-4, may be attached while installing the flexible cable assembly 110-4 and then detached when the installation is complete. In some cases, the same removable liner 117-4 (or a new removable liner) may be re-attached to the flexible cable assembly 110-4 during a disassembly process and/or during a reinstallation process. Thus, in some cases, the adhesion or attachment technique is configured to provide more than one attachment or re-attachment.

The addition of the removable liner 117-4 may also be combined with one or more of the configurations described above. In particular, the removable liner may be combined, for example, with the flexible cable assembly 110-3 described above with respect to FIG. 4. That is, the removable liner 117-4 may be combined with a connector base 111-3 having sacrificial solder connections 116-3. The removable liner 117-4 may also be combined with the flexible cable assemblies 110-1 and 110-2 described above with respect to FIGS. 2 and 3.

Similar to the examples described above, the flexible cable assembly 110-4 depicted in FIG. 5 is configured to electrically and mechanically couple to the circuit board 101-4. As shown in FIG. 5, the (male) connector body 111-4 is configured to electrically couple to the mating (female) connector body 121-4. In this example, the mating female connector body 121-4 is electrically connected and mechanically attached to the circuit board 101-4. As described above with respect to the previous examples, the flexible cable assembly 110-4 may also be configured to electrically connect the circuit board 101-4 to another circuit board, or alternatively, with another type of electrical component of the electronic system.

The examples provided above with respect to FIGS. 1-5 are directed to one type of connector body configuration. Specifically, in the examples provided above, the flexible cable assembly includes a male-type connector body and the circuit board includes a female-type connector body. However, other variations are possible, including having a female-type connector body integrated into the flexible cable assemblies and a male-type connector body attached to the circuit boards.

Figure 6:
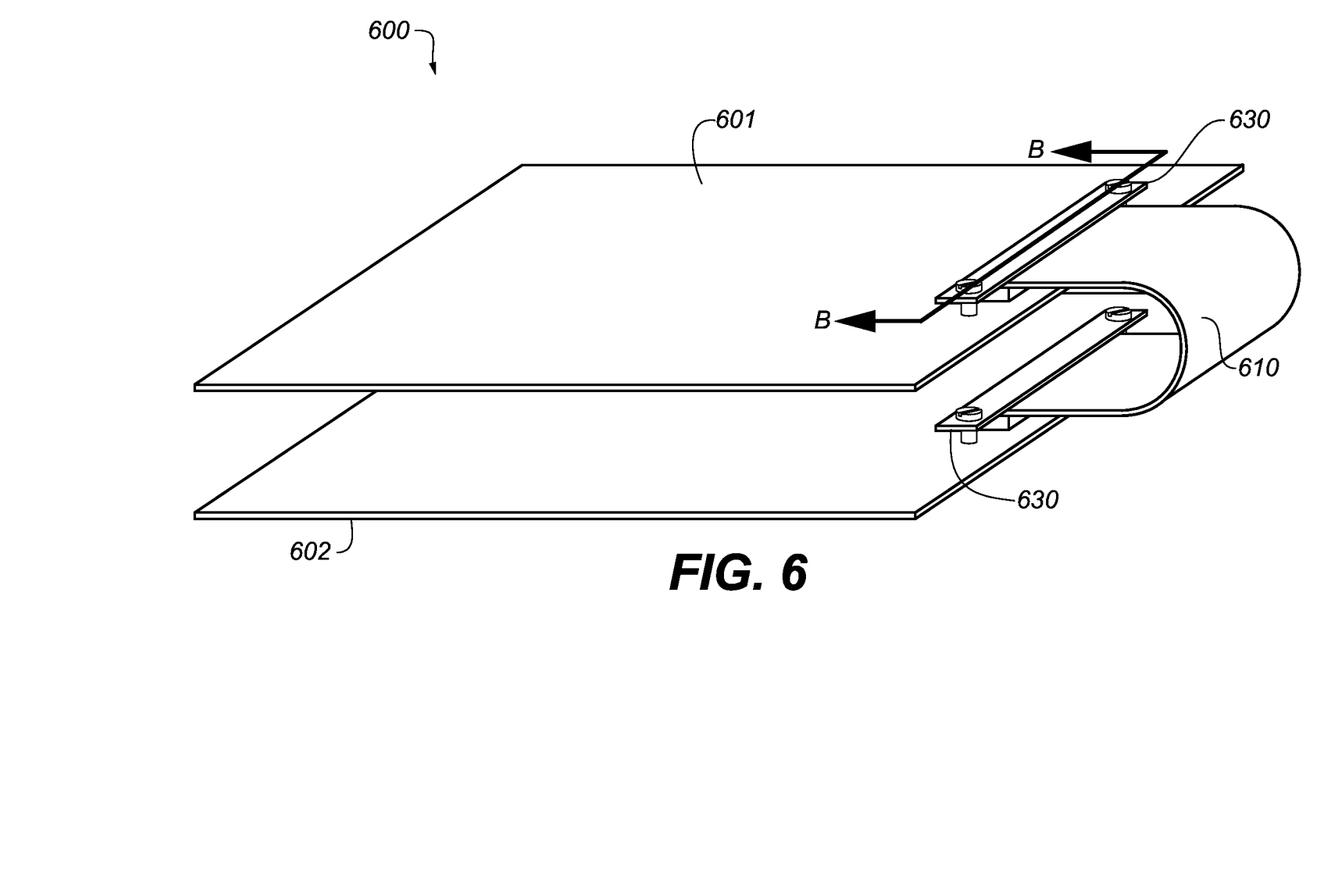
FIG. 6 depicts another example printed circuit board configuration with a board-to-board connector using a cowling retainer.

In addition to the examples provided above with respect to FIGS. 1-5, the dimensional profile of other types of connector schemes can be reduced using other techniques. FIG. 6 depicts another connection configuration that can be used to electrically connect two or more circuit boards. In particular, the electronic system 600 of FIG. 6 depicts a connector configuration having a cowling 630 that is configured to prevent the flexible cable assembly 610 from detaching from the first circuit board 601. As shown in FIG. 6, a cowling 630 can also be used on the other end of the flexible cable assembly 610 to prevent inadvertent detachment from the second circuit board 602. The configuration of the mating connectors, the flexible cable assembly, and the board orientation may be similar to as described above with respect to FIGS. 1-5.

Figure 7:
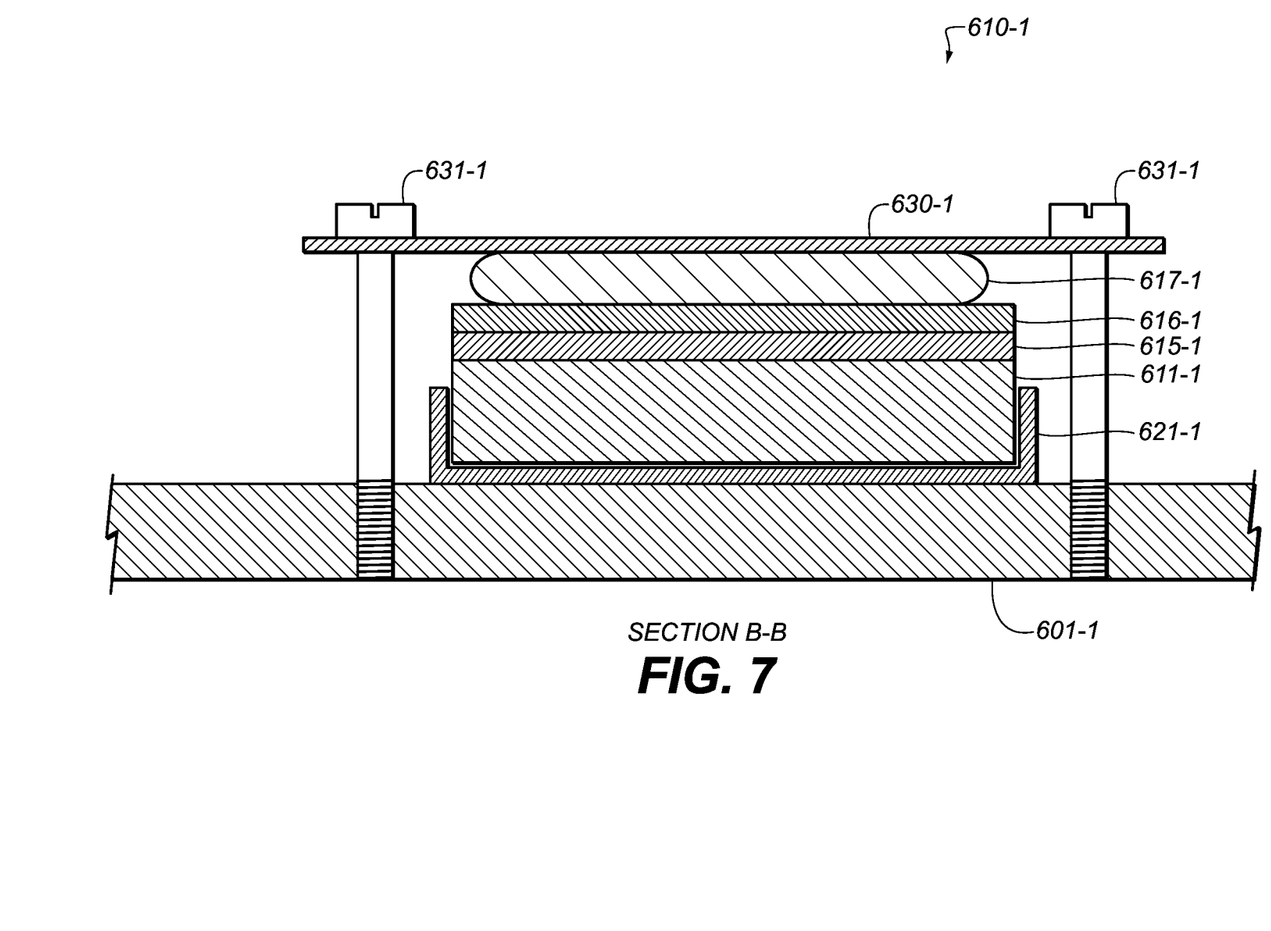
FIG. 7 depicts an example board-to-board connector having a cowling retainer.
Figure 8:
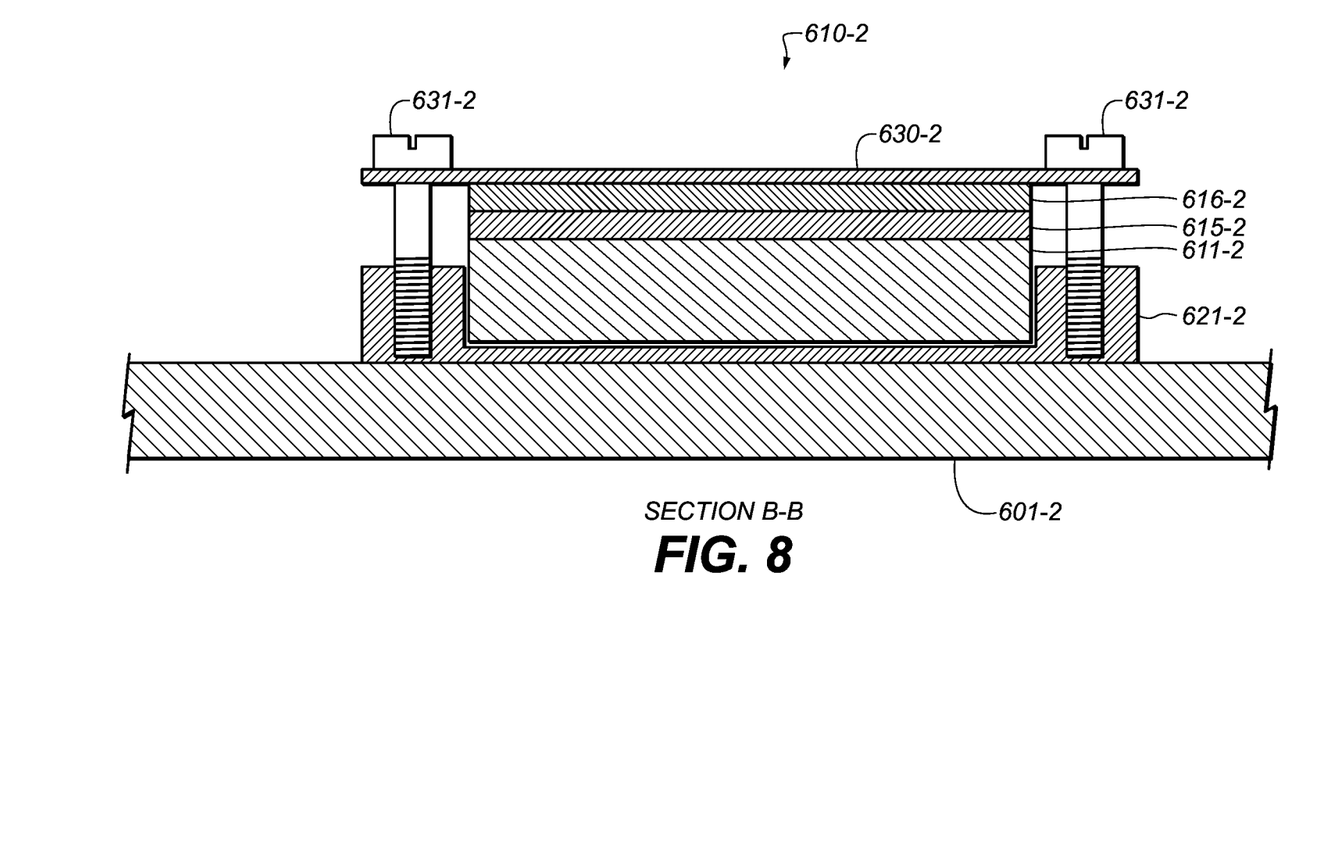
FIG. 8 depicts an example board-to-board connector having a cowling retainer attached to a connector body.
Figure 9:
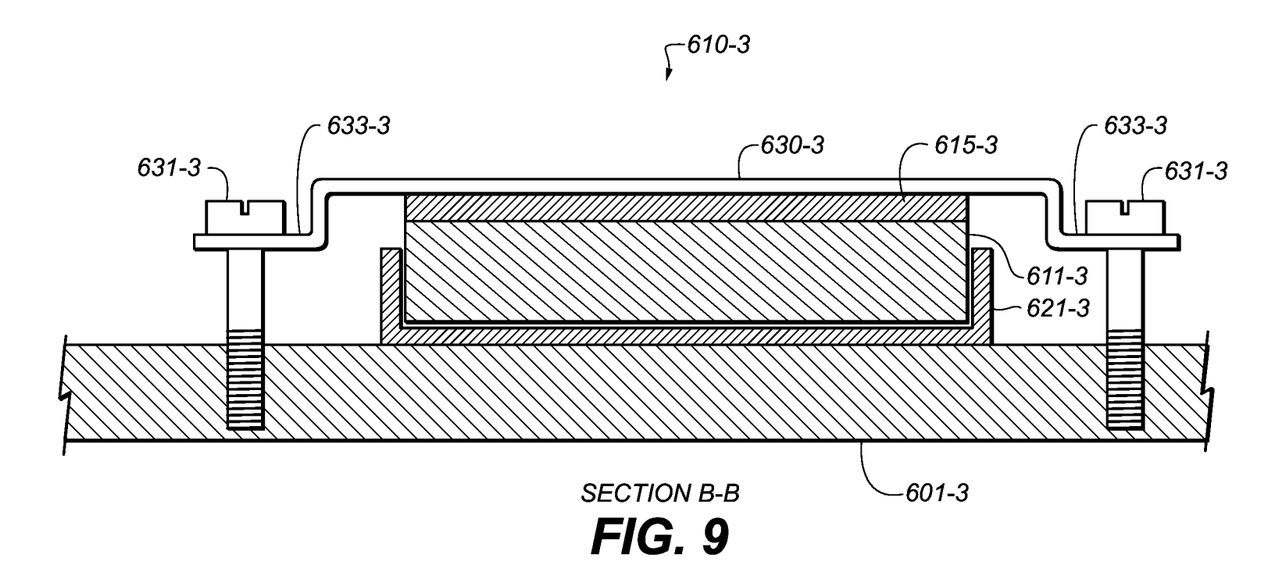
FIG. 9 depicts an example board-to-board connector having a cowling retainer integrated with a support element of the cable assembly.

FIGS. 7-9 depict alternative connector configurations that use a variation of a cowling to retain a flexible cable assembly to a printed circuit board. In some of the embodiments described below, one or more of the dimensions is reduced with respect to some traditional techniques. In particular, the width, the height, or both dimensions may be reduced which may be advantageous if space is limited.

FIG. 7 depicts an example board-to-board connector having a cowling retainer. In particular, FIG. 7 is a cross-sectional view along section B-B depicting flexible cable assembly 610-1 retained using cowling 630-1. In this example, the cowling 630-1 is attached to the circuit board 601-1 using threaded fasteners 631-1. The fasteners 631-1 may be inserted in to a threaded portion of the circuit board 601-1, or alternatively, a separate nut or threaded insert attached to the circuit board 601-1. Two example threaded inserts are provided in FIGS. 11A-B and similarly configured threaded inserts may be used to engage the fasteners 631-1 of the present example.

As shown in FIG. 7, the flexible cable assembly 610-1 includes a connector body 611-1 attached to a first end of the flexible circuit 615-1. The flexible cable assembly 610-1 also includes a support element 616-1 attached to the opposite face of the flexible circuit 615-1. A compressible element 617-1 element is also disposed between the bottom surface of the cowling 630-1 and the top surface of the support element 616-1. The compressible element 617-1 may provide compliance for variations in the height of components. The compressible element 617-1 may also provide a downward force for retaining the flexible cable assembly 610-1.

As shown in FIG. 7, the (male) connector body 611-1 is inserted into a mating (female) connector body 621-1 that is attached to the circuit board 601-1. The female connector body 621-1 is also electrically coupled to the circuit board 601-1 via one or more solder connections or other electrical coupling interface.

The configuration shown in FIG. 7 may prevent the flexible cable assembly 610-1 from inadvertently detaching from the circuit board 601-1. However, in some cases, the fastening configuration used to attach the cowling 630-1 may not be feasible or practical for compact circuit board layouts. In particular, the space required to attach the fasteners 631-1 to the circuit board 601-1 may take up valuable space that may be used to mount other electrical components or for conductive traces on the circuit board 601-1.

Thus, in some cases, it may be advantageous to integrate the fasteners into the (female) connector that is already attached to the circuit board. The configuration of FIG. 8 depicts an example board-to-board connector having a cowling attached directly to the connector body. In particular, FIG. 8 is a cross-sectional view along section B-B depicting flexible cable assembly 610-2 retained using cowling 630-2. In this example, the cowling 630-2 is attached directly to the connector body 621-2 using threaded fasteners 631-2. In the present example, the fasteners 631-2 are inserted into a threaded portion or boss formed into the connector body 621-1.

One advantage of the configuration depicted in FIG. 8 is that the circuit board 601-2 may not require as much space to accommodate the threaded fasteners 631-2. This may provide additional space to integrate additional electrical components or electrical traces into the circuit board 601-2. While the connector body 621-2 may increase in size to accommodate the threaded portion or boss, the overall space required to attach the cowling may be reduced as compared other configurations, such as the cowling attachment configuration depicted in FIG. 7.

As shown in FIG. 8, the flexible cable assembly 610-2 includes a connector body 611-2 attached to a first end of the flexible circuit 615-2 on a first surface. The flexible cable assembly 610-2 also includes a cowling 630-2 disposed above a second surface of the flexible circuit 615-2, opposite to the first surface. A support element 616-2 is disposed between the cowling 630-2 and the second surface of the flexible circuit 615-2. As shown in FIG. 8, additional components, such as a compressible element may be omitted between the bottom surface of the cowling 630-2 and the flexible cable assembly 610-2. This configuration may reduce the overall height of the connection and facilitate integration into compact electronics systems.

Similar to previous examples, the (male) connector body 611-2 is inserted into the mating (female) connector body 621-2 that is attached to the circuit board 601-2. The female connector body 621-2 is also electrically coupled to the circuit board 601-2 via one or more solder connections or other electrical coupling interface. In some cases, the solder connections between the female connector body 621-2 and the circuit board 601-2 are sufficient to provide the structural bond necessary to retain both the female connector body 621-2 and the flexible cable assembly 610-2 that is also attached to the connector body 621-2. In some cases, the connector body 621-2 may also be attached to the circuit board 601-2 using an adhesive or mechanical fastener to improve the structural bond between the two pieces.

In some situations, it may be advantageous to further reduce the overall height of the cowling and flexible cable assembly. In particular, if the board-to-board connector is the tallest component on the circuit board, it may be the limiting factor when integrating the circuit board with other components in a compact enclosure or device. One technique to further reduce the overall height of the board-to-board connection is to integrate the cowling and the support element into a single part.

FIG. 9 depicts an example board-to-board connector having a cowling retainer that also serves as a support element for the cable assembly. Similar to the examples provided above, FIG. 9 is a cross-sectional view along section B-B depicting flexible cable assembly 610-3 retained using cowling 630-3. However, in this example, the cowling 630-3 is attached directly to a surface of the flexible circuit 615-3. Specifically, the cowling 630-3 is attached to a first surface that is opposite to a second surface that is attached to the connector body 611-3.

One advantage of the configuration depicted in FIG. 9 is that the cowling 630-3 performs multiple functions. First, the cowling 630-3 is configured to serve as a retainer to prevent inadvertent detachment of the flexible cable assembly 610-3. In this example, the cowling 630-3 is configured to be fastened to the circuit board 601-3 using threaded fasteners 631-3. Second, the cowling 630-3 is configured to provide structural rigidity to the flexible cable assembly 610-3. In this example, the cowling 630-3 is formed from a steel material that resists bending and deflection of the flexible circuit 615-3. While the cowling 630-3 is formed from steel, other materials may also be used. The support provided by the cowling 630-3 may protect the solder connection between the flexible circuit 615-3 and the connector body 611-3.

In this example, the structural support provided by the cowling 630-3 is sufficiently rigid that an additional support element is not required. Because the flexible cable assembly 610-3 does not include a support element or other component between the flexible circuit 615-3 and the cowling 630-3, the overall height of the flexible cable assembly 610-3 may be reduced. In some cases, the overall thickness of the flexible cable assembly 610-3 can be reduced by 0.1 mm or more.

Similar to previous examples, the (male) connector body 611-3 is inserted into the mating (female) connector body 621-3 that is attached to the circuit board 601-3. The female connector body 621-3 is also electrically coupled to the circuit board 601-3 via one or more solder connections or other electrical coupling interface. Also, as shown in FIG. 9, the threaded fasteners 631-3 attach the cowling 630-3 to the circuit board 601-3. Two example threaded inserts are provided in FIGS. 11A-B and similarly configured threaded inserts may be used to engage the fasteners 631-3 of the present example. However, in an alternative embodiment, the threaded fasteners may attach the cowling directly to the mating female connector, similar to as described above with respect to FIG. 8.

The overall height of the cable assembly can be even further reduced by providing an offset feature 633-3 in the cowling 630-3. As shown in FIG. 9, the cowling 630-3 includes an offset feature 633-3 at each end of the cowling 630-3. The cowling 630-3 also includes a clearance hole within each of the offset features 633-3 for receiving each of the threaded fasteners 631-3. The offset features 633-3, as depicted in FIG. 9 are at least as large as the thickness of the heads of the fasteners 631-3 used to attach the cowling 630-3. Thus, as shown in FIG. 9, the offset features 633-3 results in head of the fasteners 631-3 being flush or below flush with respect to the top of the cowling 630-3.

In the present example, the cowling 630-3 is formed from a sheet-metal material and the offset features 633-3 are formed as bends in the sheet metal material. As shown in FIG. 9, the offset feature 633-3 may be formed by bending the cowling 630-3 downward (here at approximately −90 degrees) and then outward (here approximately +90 degrees). The configuration depicted in FIG. 9 is merely one example, and variations in the cowling geometry are possible. Additionally, the cowling 630-3 may be formed from another type of material, such as aluminum, plastic, or composite, and the offset features 633-3 may be formed by a molding, machining, forming, or other type of manufacturing process.

Figure 10A:
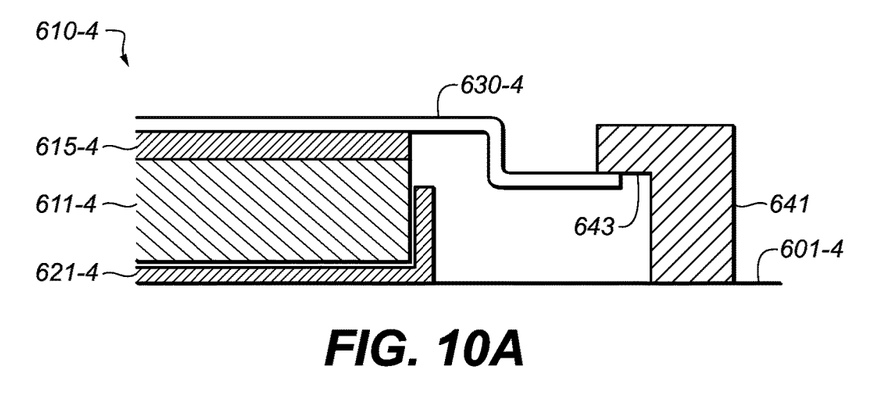
FIGS. 10A-B depict alternative configurations for attaching a cowling to a printed circuit board.
Figure 10B:
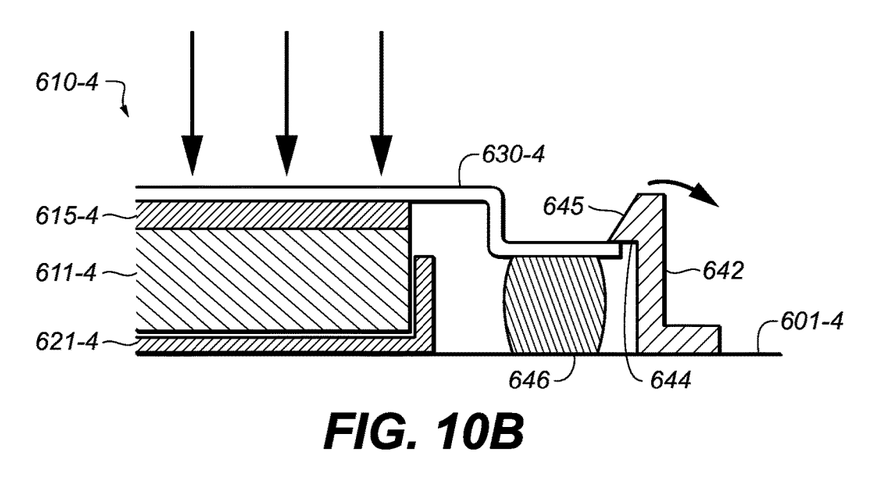

In the examples provided above with respect to FIGS. 7-9, the cowling is attached to the circuit board (or a connector body) using a threaded fastener. However, in alternative embodiments, the cowling may be attached to the circuit board using an alternative fastening technique. In particular, FIGS. 10A-B depict alternative configurations for attaching a cowling to a printed circuit board. The examples depicted in FIGS. 10A-B may be used to attach any of the cowlings described above with respect to FIGS. 7-9.

In the example depicted in FIG. 10A, a retainer clip 641 is attached to the circuit board 601-4. The retainer clip 641 includes an undercut feature 643 that is configured to engage a top surface of the cowling 630-4. In the present example, the undercut feature 643 is formed as a flat shelf that retains the cowling 630 against the circuit board 601-4, The retainer clip 641 may be attached to the circuit board 601-4 by an adhesive, threaded fastener, or other similar mechanical fastening technique.

The retaining clip 641 of FIG. 10A may be used in combination with any of the cowlings described above with respect to FIGS. 7-9. For example, the retaining clip 641 may be used in place of one or both of the threaded fasteners depicted in FIGS. 7-9. In the present example, the cowling 630-4 is attached directly to a surface of the flexible circuit 615-4. A connector body 611-4 is attached to the other, opposite surface of the flexible circuit 615-4 and electrically and mechanically connects to a (female) mating connector 621-4.

In some cases, the cowling 630-4 is configured to deflect slightly when engaged by the undercut 643 of the retainer clip 641. In this case, the deflection in the cowling 630-4 may allow for a small variation in the height of the components and may also maintain a positive force between the flexible cable assembly 610-4 and the circuit board 601-4. Alternatively, in some cases, a spring or compressible element is disposed between the circuit board 601-4 and the cowling 630-4 to maintain a positive force between the top surface of the cowling 630-4 and the undercut 643.

FIG. 10B depicts another alternative configuration for attaching a cowling to a printed circuit board. In the example depicted in FIG. 10b, a retainer clip 642 is attached to the circuit board 601-4. As in the previous example, the retainer clip 642 also includes an undercut feature 644 that is configured to engage a top surface of the cowling 630-4. Similar to the example provided above, the retainer clip 642 may be attached to the circuit board 601-4 by an adhesive, threaded fastener, or other similar mechanical fastening technique.

The retaining clip 642 of FIG. 10B may be used in combination with any of the cowlings described above with respect to FIGS. 7-9. For example, the retaining clip 642 may be used in place of one or both of the threaded fasteners depicted in FIGS. 7-9. In the present example, the cowling 630-4 is attached directly to a surface of the flexible circuit 615-4. A connector body 611-4 is attached to the other, opposite surface of the flexible circuit 615-4 and electrically and mechanically connects to a (female) mating connector 621-4.

As shown in FIG. 10B, the retainer clip 642 include a tapered feature 645 that may facilitate installation of the cowling 630-4. In this example, the cowling 630-4 is configured to be installed by pressing the cowling 630-4 toward the first circuit board 601-4 as indicated by the downward arrows in FIG. 10B. In this case, the cowling 630-4 is configured to deflect as the cowling 630-4 is being installed. The tapered feature 645 is configured to engage the edge of the cowling 630-4 as the cowling 630-4 is being installed. In particular, the edge of the cowling 630-4 slides down the tapered feature 645 deflecting the retainer clip 642 away from the cowling 630-4. As shown in FIG. 10B, the retainer clip 642 is also configured to return to an un-deflected state when the installation is complete. In some cases, the retainer clip 642 may be formed from an elastic material that is capable of deflecting during the installation process without plastically deforming or breaking. Suitable materials used for the retainer clip include, without limitation, polyethylene, polymide, spring steel, or other material having elastic properties. The shape of the retainer clip 642, including the thickness of the retainer clip 642 and the depth of the undercut feature 644 may also be configured to facilitate deflection during installation of the cowling 630-4.

As shown in FIG. 10B, a compressible element 646 is disposed between the circuit board 601-4 and the cowling 630-4 to maintain a positive force between the top surface of the cowling 630-4 and the undercut 644. Alternatively, as previously mentioned, the cowling 630-4 may also be configured to deflect slightly when engaged by the undercut 644 of the retainer clip 642.

The cowling 630-4 in FIGS. 10A-B is depicted as having an offset feature. In some cases, this may be advantageous in reducing the overall height of the connection. In particular, the offset feature allows the retainer clip (641 or 642) to remain flush or below flush with respect to the top surface of the cowling 630-4. However, in alternative embodiments, the cowling may not include an offset feature and may, for example, have a flat or planar shape.

Figure 11A:
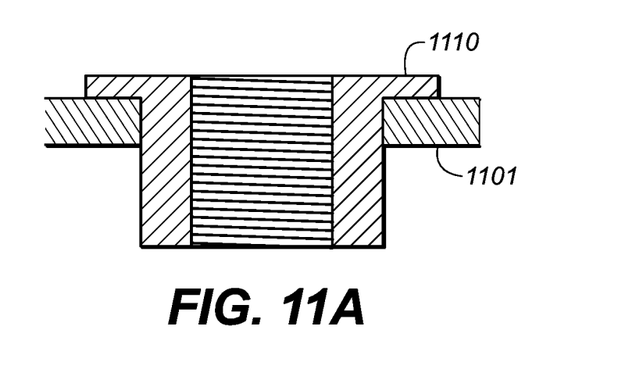
FIGS. 11A-B depict example threaded inserts for attaching a cowling to a printed circuit board.
Figure 11B:
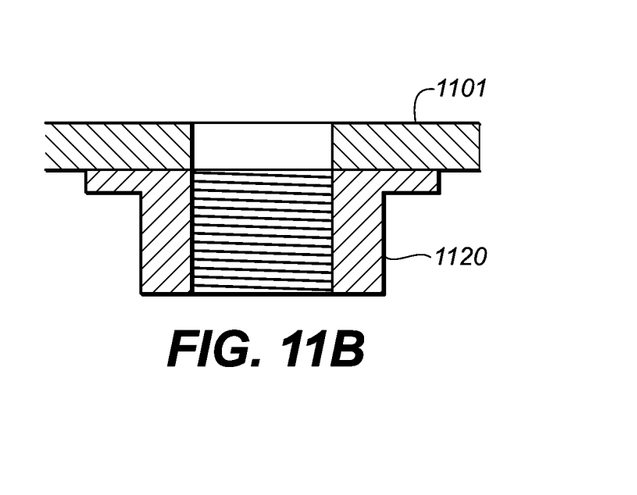

As described above, threaded fasteners can be used to attach a cowling to a printed circuit board. FIGS. 11A-B depict example threaded inserts that can be installed in a printed circuit board and used for attaching a cowling. FIG. 11A depicts a threaded insert 1110 having a flange that engages with the top surface of a circuit board 1101. The threaded insert 1110 may be installed by pressing the insert 1110 into a hole in the circuit board 1101. Additionally or alternatively, the threaded insert 1110 may be laser-welded around the perimeter of the flange to bond the flange with the top surface of the circuit board 1101. In some cases, another bonding technique is used to fix the threaded insert 1110 to the circuit board 1101. FIG. 11B depicts another example threaded insert 1120 attached to the bottom surface of the circuit board 1101 using a flange. In some cases, the flange may be laser welded along the perimeter to the bottom surface of the circuit board 1101.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

We claim:

1. A flexible cable assembly for electrically connecting a first circuit board to another electronic component, the flexible cable assembly comprising:
a flexible circuit having a first end and a second end; and
a connector body attached to the first end of the flexible circuit and configured to electrically connect the first circuit board to the flexible circuit,
wherein the connector body attaches to the flexible circuit via an array of solder leads that convey electrical signals between the flexible circuit and the first circuit board, the array of solder leads are formed into and substantially supported by the connector body, the array of solder leads comprises L-shaped solder leads, and the array of solder leads is fully encapsulated in the connector body prior to the flexible circuit being electrically connected to the first circuit board, except for a planar contact area that is in electrical contact with the flexible circuit.

2. The flexible cable assembly of claim 1, wherein the flexible cable assembly does not include a support element attached to a surface of the flexible circuit opposite to a surface used to attach the connector body, wherein the support element is a separate part configured to reduce bending of the flexible circuit near the first end.

3. The flexible cable assembly of claim 1, wherein the array of solder leads are electrically connected to a corresponding array of contact pad regions formed into a surface of the flexible circuit.

4. The flexible cable assembly of claim 1, further comprising:
a sacrificial solder connection formed between the flexible circuit and the connector body, wherein the sacrificial solder connection is not configured to convey electrical signals between the flexible circuit and the first circuit board.

5. The flexible cable assembly of claim 4, wherein the sacrificial solder connection is located proximate to one end of the connector body.

6. The flexible cable assembly of claim 1, further comprising: a removable lining that is attached to the first end of the flexible circuit, wherein the removable lining is configured to be detached after the flexible cable assembly has been installed.

7. The flexible cable assembly of claim 6, wherein the removable lining is attached using an adhesive and the adhesive is configured to be detached and reattached to the flexible circuit.

8. A flexible cable assembly comprising:
a flexible laminate; and
a connector body attached to the flexible laminate and configured to electrically connect the flexible cable assembly to a separate electrical component, wherein:
 the connector body is mechanically attached to the flexible laminate via an array of solder leads, and
 the array of solder leads are formed into and encapsulated by the connector body; and
sacrificial solder connections formed between the flexible circuit and the connector body, wherein the sacrificial solder connections do not form an electrical connection between the flexible circuit and the connector body, the solder leads are interposed between the sacrificial solder connections, and the solder leads are separated from the sacrificial solder connections by a portion of the connector body.

9. The flexible cable assembly of claim 8, wherein an opposing surface of the flexible laminate is exposed on a side opposite to the connector body.

10. The flexible cable assembly of claim 8, wherein the array of solder leads do not extend beyond a profile of the connector body.

11. The flexible cable assembly of claim 8, wherein the sacrificial solder connection is located proximate to an edge of the connector body.

12. The flexible cable assembly of claim 8, wherein the array of solder leads are encapsulated by the body except for a contact area that is in electrical contact with the flexible circuit.

* * * * *